United States Patent
Schmid

(10) Patent No.: US 8,860,307 B2
(45) Date of Patent: Oct. 14, 2014

(54) ILLUMINATION APPARATUS FOR DAZZLE-FREE ILLUMINATION, METHOD, USE AND ARRANGEMENT COMPRISING THE ILLUMINATION APPARATUS

(71) Applicant: Diehl Aerospace GmbH, Ueberlingen (DE)

(72) Inventor: Frank Schmid, Poppenricht (DE)

(73) Assignee: Diehl Aerospace GmbH, Uberlingen (DE)

( * ) Notice: Subject to any disclaimer, the term of this patent is extended or adjusted under 35 U.S.C. 154(b) by 0 days.

(21) Appl. No.: 13/744,647

(22) Filed: Jan. 18, 2013

(65) Prior Publication Data
US 2013/0188332 A1 Jul. 25, 2013

(30) Foreign Application Priority Data
Jan. 21, 2012 (DE) .......................... 10 2012 001 143

(51) Int. Cl.
*F21V 9/00* (2006.01)
(52) U.S. Cl.
CPC ....................................... *F21V 9/00* (2013.01)
USPC .............. 313/512; 313/506; 313/507; 362/84
(58) Field of Classification Search
USPC ................................. 313/498–512; 252/301.4
See application file for complete search history.

(56) References Cited

U.S. PATENT DOCUMENTS

| | | | | |
|---|---|---|---|---|
| 6,758,586 | B1 * | 7/2004 | Wilhem et al. | 362/471 |
| 8,039,862 | B2 * | 10/2011 | Tran et al. | 257/99 |
| 2007/0080364 | A1 | 4/2007 | Hsiung | |
| 2010/0265693 | A1 * | 10/2010 | Ryu et al. | 362/84 |
| 2011/0084232 | A1 * | 4/2011 | Mueller-Mach et al. | 252/301.4 F |
| 2013/0188345 | A1 * | 7/2013 | Schmid | 362/231 |
| 2013/0188351 | A1 * | 7/2013 | Schmid | 362/235 |

FOREIGN PATENT DOCUMENTS

DE 69907652 T2 3/2004

OTHER PUBLICATIONS

Wu et al.,Three Band White Light From InGaN-Based Blue LED Chip Precoated With Green/Red Phosphors,Ieee photonics technology letters, vol, 17, No. 6, Jun. 2005.*

* cited by examiner

*Primary Examiner* — Tracie Y Green
(74) *Attorney, Agent, or Firm* — Scully, Scott, Murphy & Presser, P.C.

(57) ABSTRACT

An improved illumination apparatus for the dazzle-free illumination of a region monitored by a night vision instrument is provided. The illumination apparatus has an illumination device, which has at least one light-emitting diode chip and a luminous means. The light-emitting diode chip is formed to emit electromagnetic radiation of a first wavelength range. The luminous means is formed to convert the radiation of the first wavelength range into light with light in a second wavelength range. The second wavelength range is shorter than 610 nm.

13 Claims, 3 Drawing Sheets

ILLUMINATION APPARATUS FOR DAZZLE-FREE ILLUMINATION, METHOD, USE AND ARRANGEMENT COMPRISING THE ILLUMINATION APPARATUS

BACKGROUND OF THE INVENTION

The invention relates to an illumination apparatus for the dazzle-free illumination of a region monitored by a night vision instrument, having an illumination device, the illumination device comprising at least one light-emitting diode chip and a luminous means, the light-emitting diode chip being formed in order to emit electromagnetic radiation of a first wavelength range, and the luminous means being formed in order to convert the radiation of the first wavelength range, generated by the light-emitting diode chip, into light with light components in the visible spectrum in a second wavelength range. The invention also relates to a use of the illumination apparatus, to a method with the illumination apparatus and to an arrangement, which likewise comprises the illumination apparatus.

DISCUSSION OF THE PRIOR ART

In regions which are insufficiently lit for human eyes, night vision instruments make it possible to form high-contrast images of the regions. To this end, night vision instruments often use a wavelength range which lies above the wavelength range of light which is visible to the human eye. In this case, on the one hand it is possible for the night vision instruments to use existing residual light, particularly in the said wavelength range, and on the other hand it is possible for the regions to be lit actively with illumination of which the wavelength range used likewise lies above the range which is visible to the human eye.

Often, however, the technical challenge arises that on the one hand a night vision instrument is intended to be used in an environment, but on the other hand regions of the environment are intended to be illuminated so that these regions are perceptible to humans with the "unarmed" eye, that is to say without a night vision instrument. One typical field of application is found in aircraft illumination, parts of the interior of the aircraft being illuminated with light visible to humans but pilots being intended to use a night vision instrument. If conventional illumination is used to illuminate the interior, then this would dazzle, i.e. overdrive, the night vision instruments.

Document DE69907652T2, which in fact forms the closest prior art, relates to an aircraft illumination apparatus compatible with a night vision instrument, the intention being for this illumination apparatus to be used together with a night vision instrument. In this document, it is proposed to use a white LED as illumination means for the illumination apparatus, on the grounds that the light components of the white LED, which can be picked up by the night vision instrument, are so small that they no longer cause perturbation.

SUMMARY OF THE INVENTION

It is an object of the invention to provide an improved illumination apparatus for the dazzle-free illumination of a region monitored by a night vision instrument. This object can be achieved by an illumination apparatus according to one aspect of the invention, by a method for illumination according to another aspect of the invention, and by an arrangement according to yet another aspect of the invention.

In the scope of the invention, an illumination apparatus is disclosed which is formed for the dazzle-free illumination of a region monitored by a night vision instrument.

In the context of the invention, dazzle-free is intended in particular to mean that the illumination apparatus and the night vision instrument are compatible during operation, in such a way that an overlap of the field of view of the night vision instrument and an illumination region of the illumination apparatus is possible without perturbation and/or causes no blooming effect, no overdrive and/or no dazzle in the night vision instrument.

The region may be any kind of region, for example a control centre in a factory etc., an interior of a vehicle, aircraft etc., and in particular a cockpit of the aircraft. The region is monitored by the night vision instrument intentionally or unintentionally. Thus, it is possible for the region illuminated by the illumination apparatus to unintentionally enter the field of view of the night vision instrument and therefore be associated with the monitored region.

The night vision instrument is a device which permits or improves visual perception in regions which lie in natural darkness or dim light. For such a night vision instrument, the term "Night Vision Imaging System" NVIS has become established. The night vision instrument uses wavelength ranges which lie outside or substantially outside the visible spectrum. The night vision instrument is particularly preferably formed as a wearable apparatus which is put on by a user in order to monitor the region. The night vision instrument only picks up light with a wavelength of more than a cutoff wavelength.

The illumination apparatus comprises an illumination device, the illumination device comprising at least one light-emitting diode chip and a luminous means. The light-emitting diode chip is formed in order to emit electromagnetic radiation, in particular light, of a first wavelength spectrum. The luminous means is formed in order to convert the electromagnetic radiation of the first wavelength range, generated by the light-emitting diode chip, into light with light components in the visible spectrum in a second wavelength range. In particular, light with shorter wavelengths is converted into light with longer wavelengths by the conversion. The visible spectrum generally has a wavelength range of from 400 nm to 700 nm.

According to the invention, it is proposed that the second, visible wavelength range lie below 610 nm. The light converted by the luminous means therefore exists exclusively in the spectrum below 610 nm. Preferably, less than 0.1%, and particularly preferably less than 0.01%, of the power of the converted light is emitted in a wavelength range of more than 610 nm. Preferably, only power components with wavelengths of between 300 nm and 1000 nm are considered and therefore, for example, power components in the range of thermal radiation are omitted from consideration.

It is in this case a concept of the invention that the perturbations of night vision instruments by the illumination apparatus in the monitored region can be significantly restricted, or even entirely eliminated, by excluding electromagnetic radiation with a wavelength of more than 610 nm during the conversion. The cutoff wavelength of the night vision instrument is preferably greater than 610 nm.

As a result, an NVIS-compatible illumination apparatus, preferably corresponding to the MIL-STD-3009 NVIS white is provided by the invention, which has a very high efficiency since, during the conversion, no light above 610 nm is generated which subsequently has to be filtered out and therefore constitutes a power loss. Owing to the high efficiency, the received power can be selected to be low. As a secondary effect, less heat loss is incurred, which in turn has repercussions on the size of the heat sink required and therefore on the weight of the illumination apparatus. Furthermore, expedient light guiding and/or shaping, for example by secondary lenses, is facilitated.

According to a preferred embodiment of the invention, the luminous means is formed as a fluorescent means, scintillation means or as a phosphorescent means, which converts the electromagnetic radiation generated by the light-emitting diode chip into the second wavelength range as light with the light components in the visible spectrum.

Particularly preferably, the luminous means is selected in such a way that the colour locus criterion for NVIS white is satisfied for the illumination device.

In one possible configuration of the invention, the luminous means is formed in a liquid aggregate state, but particularly preferably in a solid aggregate state since this aggregate state is structurally simpler to incorporate into the illumination device.

In one possible configuration of the invention, the liquid luminous means is formed as a mixture of at least one or a few dyes from the company Lambda Physik AG, Göttingen, Germany, with the designations LC 5900 (Rhodamine 6G), LC 5400 (Coumarin 153), LC 5000 (Coumarin307), LC4800 (Coumarin 102), LC 4700 (Coumarin 47) and optionally others with a solvent. The mixture may, for example, be arranged in front of the light-emitting diode chip by means of a cuvette.

In another possible embodiment of the invention, the luminous means is formed as an $SrGa_2S_4$:Eu composite, this composite having an intensity maximum at 535 nm.

In a preferred embodiment of the invention, the at least one light-emitting diode chip is embedded together with the luminous means in a plastic package. For example, the luminous means is applied directly on the light-emitting diode chip or arranged separately inside the plastic package for the conversion of the first wavelength range. Preferably, the plastic package comprises at least one radiation-transparent section for the transmission of the light converted by the luminous means, the entire plastic package particularly preferably being formed so that it is radiation-transparent. For example, the light-emitting diode chip and the luminous means are potted together in the plastic package by using a plastic potting compound, or the plastic package is formed by the plastic potting compound.

In a preferred embodiment of the invention, the at least one light-emitting diode chip is formed as a light-emitting diode chip emitting blue light. The intensity maximum, or the peak, of the light-emitting diode chip emitting blue light lies in a wavelength range of between 400 and 480 nm, and is preferably 470 nm. By mixing the spectrum of the luminous means and the spectrum of the light-emitting diode chip, a colour mixture is generated which illuminates with particular colour fidelity and/or corresponds to NVIS MIL-STD 3009.

As an alternative, the at least one light-emitting diode chip is formed as a light-emitting diode chip emitting UV light. The intensity maximum, or the peak, of the light-emitting diode chip emitting UV light lies in a wavelength range of between 250 nm and 400 nm, and is preferably 260 nm. The wavelength ranges of both the blue and the UV light, as short-wavelength light, make it possible for the luminous means to convert into the second wavelength range as light with light components in the visible spectrum as longer-wavelength light.

In a particularly preferred embodiment of the invention, the illumination device is formed as a white LED—also referred to as a white-light LED. Such white LEDs comprise the blue or UV light-emitting diode chip and the luminous means, which converts the blue radiation or the UV radiation into light in the visible spectrum. For example, the spectral distribution of the white LED is characterized by a high peak in the short-wavelength range, for example 390 nm, and a broader tail section with a maximum in a visible range, for example 550 nm. The luminous means is, however, formed in such a way that the white LED does not emit any radiation in a range above 610 nm.

In an alternative embodiment of the invention, the illumination apparatus has a multiplicity of illumination devices, the illumination devices respectively comprising at least one light-emitting diode chip and the luminous means. Preferably, the illumination devices are formed as white LEDs. The multiplicity and the arrangement of the illumination devices in the illumination apparatus are preferably adapted to the working requirements of the illumination apparatus.

In another embodiment of the invention, the at least one light-emitting diode chip and the luminous means are formed as two separate components in the illumination device. For example, the illumination device may comprise a multiplicity of light-emitting diode chips and a luminous means, the luminous means being arranged as a one-part or multi-part component at a distance from the multiplicity of light-emitting diode chips. This configuration has the advantage that a standard component which is commercially available can be used as the light-emitting diode chip, and the luminous means, for example formed in the manner of a lampshade, can be manufactured separately as a special component and positioned over the at least one light-emitting diode chip.

In one possible implementation of the invention, the illumination apparatus is formed as instrument illumination, interior illumination, onboard instrument illumination, cockpit illumination and/or as a reading lamp, for example for an aircraft.

In a preferred embodiment of the invention, the illumination apparatus is arranged in the region monitored by the night vision instrument, or in the region acquired by the field of view of the night vision instrument.

The invention furthermore relates to the use of the illumination apparatus, as described above or according to one of the claims, it being used in the region monitored by the night vision instrument. In particular, the illumination apparatus is used synchronously with the night vision instrument in the region, the field of view of the night vision instrument and the illumination region of the illumination apparatus overlapping.

The invention furthermore relates to a method for the dazzle-free illumination of a region monitored by a night vision instrument, the region monitored by the night vision instrument being illuminated by an illumination apparatus according to one of the claims, or as described above.

The invention lastly relates to an arrangement which comprises a night vision instrument and an illumination apparatus according to one of the claims or as described above, the night vision instrument and the illumination apparatus being activated synchronously, and the field of view of the night vision instrument and the illumination field of the illumination apparatus overlapping.

BRIEF DESCRIPTION OF THE DRAWINGS

Other features, advantages and effects of the invention may be found in the following description of preferred exemplary embodiments of the invention and the appended figures, in which.

Parts which correspond to one another or are identical are respectively provided with the same references in the figures.

DETAILED DESCRIPTION OF THE INVENTION

Figure 1:
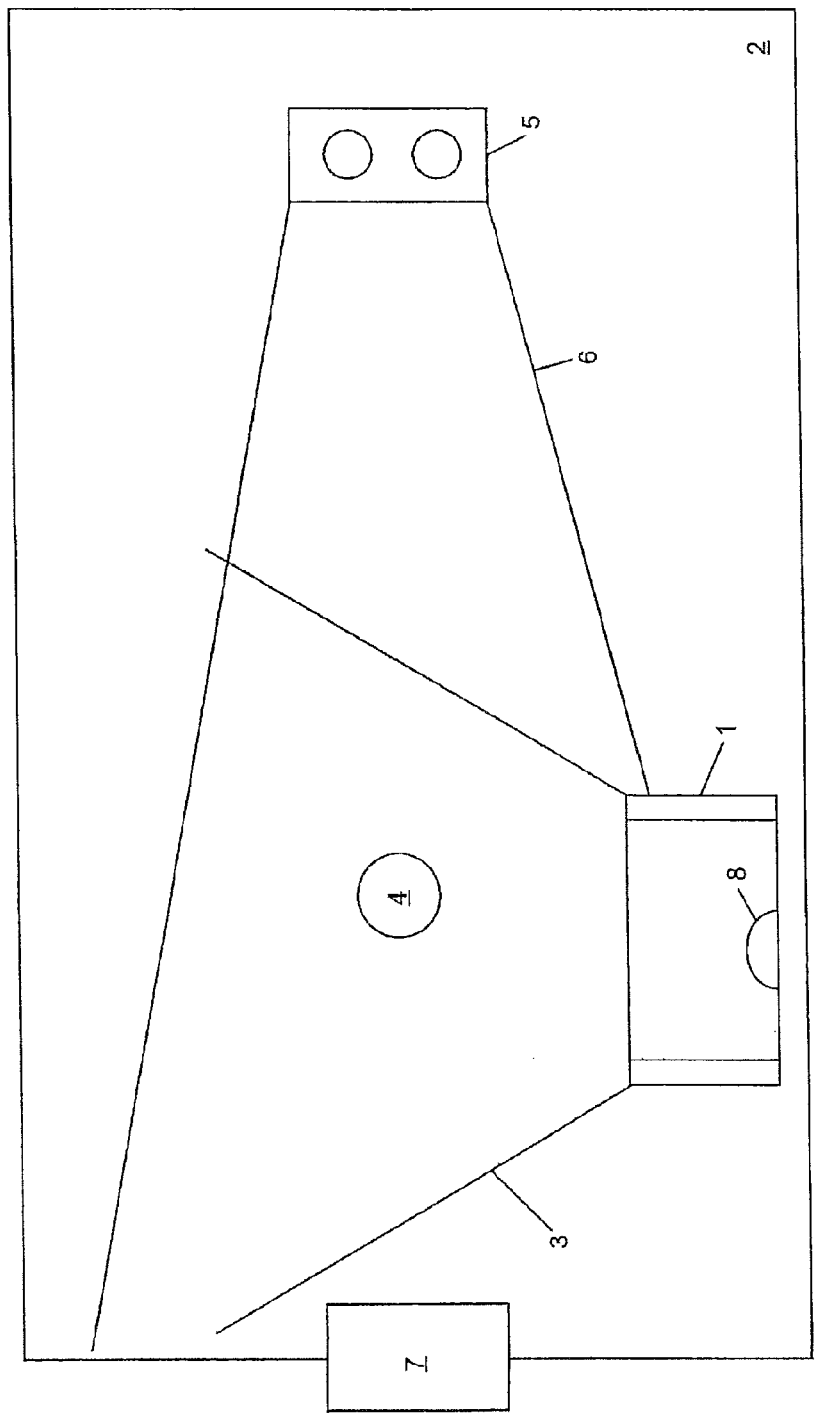
FIG. 1 shows a schematic diagram of an interior, for example a cockpit, of an aircraft, having an illumination apparatus as an exemplary embodiment of the invention.

As a schematic diagram, FIG. 1 shows an illumination apparatus 1 as an exemplary embodiment of the invention. In this exemplary embodiment, the illumination apparatus 1 is arranged in a cockpit 2 as cockpit illumination of the aircraft and has an illumination field 3, in which an arbitrary object 4 is arranged. The cockpit 2 furthermore contains a night vision instrument 5, the field of view 6 of which is oriented in such a way that it acquires both the body 4 and the illumination apparatus 1. A monitored region is defined in the cockpit 2 or outside the cockpit 2 by the field of view 6 of the night vision instrument 5. In principle, the night vision instrument 5 is oriented in such a way that it observes a scene 7, but while rather randomly also acquiring the body 4 or the illumination apparatus 1.

The illumination apparatus 1 comprises at least one illumination device 8. Conventional illumination devices regularly have an emission spectrum which collides with the sensitivity spectrum of night vision instruments 5. An overlap of the illumination region 3 of the illumination apparatus 1 with the field of view 6 of the night vision instrument 5 therefore usually leads to dazzling of the night vision instrument 5. In order to permit dazzle-free illumination of a region monitored by the night vision instrument 5, the illumination device 8 of the illumination apparatus 1 is formed in such a way that it does not generate any light components which lie in the wavelength acquisition range of the night vision instrument 5.

Figure 2:
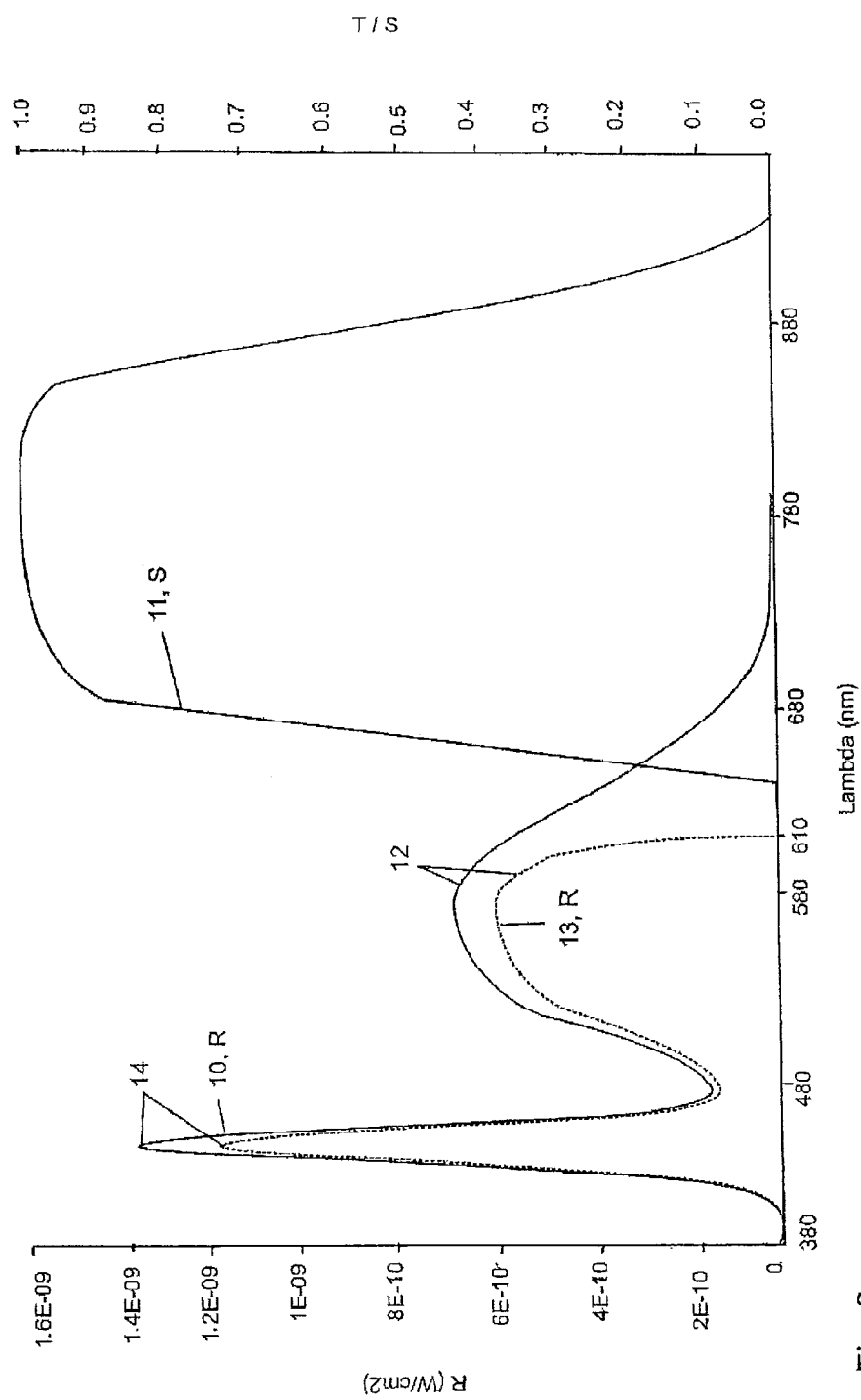
FIG. 2 shows a graph to represent the spectral properties of the illumination apparatus in FIG. 1.

FIG. 2 represents, in a graph, the emission spectrum 10 of conventional illumination devices, in this case of a commercially available white LED, and the sensitivity spectrum of an NVIS-B night vision instrument according to the specification MIL-STD-3009, which corresponds to the sensitivity spectrum 11 of the night vision instrument 5. The spectrum 13 of the light generated by the illumination device 8 in FIG. 1 is furthermore represented, this being the spectrum of a white LED in this exemplary embodiment.

The wavelength Lambda is indicated in nm on the x axis of the graph, the radiation density R in watt/cm$^2$ is plotted on the left-hand y axis and the relative sensitivity S of the night vision instrument 5, normalized to 1, is plotted on the right-hand y axis.

The emission spectrum 10 of the conventional illumination device comprises a peak 14 in a range of between 380 and 480 nm, which is followed by a tail section 12 from 480 nm to 780 nm. The sensitivity spectrum 11 of the night vision instrument 5 starts at about 630 nm and extends to about 950 nm. As can be seen from the representation, the emission spectrum 10 of conventional illumination devices and the sensitivity spectrum 11 of the night vision instrument 5 overlap in the range of between 630 nm and 780 nm.

The spectrum 13 of the illumination device 8 in FIG. 1 likewise comprises a peak 14 in a range of between 380 and 480 nm, but the subsequent tail section 12 extends from 480 nm to 610 nm. No overlap of the spectrum 13 with the sensitivity spectrum 11 of the night vision instrument 5 therefore takes place. Rather, the spectrum 13 and the sensitivity spectrum 11 are separated from one another by at least 10 nm. In this way, the illumination apparatus 1 allows dazzle-free illumination of a common region monitored by the night vision instrument 5. Conversely, in the visible range below the cutoff wavelength of 610 nm, almost normal illumination is made possible so that the user can gain a true-colour rendition of the region, and in particular of the cockpit 2, without the night vision instrument 5.

Figure 3:
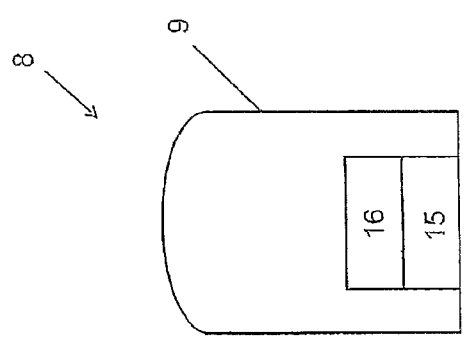
FIG. 3 shows an illumination device of the illumination apparatus in FIG. 1 in a schematic representation as a first exemplary embodiment.

FIG. 3 shows the illumination device 8 of the illumination apparatus 1 in FIG. 1 as an exemplary embodiment of the invention in a schematic representation. In this exemplary embodiment, the illumination device 8 is formed in the structure of a white LED. The illumination device 8 comprises a light-emitting diode chip 15 and a luminous means 16. To this end, the light-emitting diode chip 15 is formed in order to generate electromagnetic radiation of a first wavelength range. For example, the light-emitting diode chip 15 is formed as a light-emitting diode chip 15 emitting blue light, or as a light-emitting diode chip 15 emitting UV light. The luminous means 16 is formed in order to convert the radiation of the first wavelength range, emitted by the light-emitting diode chip 15, into a second wavelength range as light with light components in the visible spectrum. To this end, the luminous means 16 is formed as a fluorescent or phosphorescent means, for example from a photoluminescent material (a phosphor), which can convert short-wavelength, high-energy light (blue light or ultraviolet radiation) into longer-wavelength light.

The illumination device 8 comprises a plastic package 9, which is formed so that it is radiation-transparent for the transmission of the light. The light-emitting diode chip 45, which may for example be arranged on a carrier for mechanical fastening and electrical contacting, is arranged in the plastic package 9. In particular, the light-emitting diode chip 15 has a radiation-emission surface from which the light of the light-emitting diode chip 15 is emitted. The radiation-emission surface is, for example, formed by one of the surfaces of the light-emitting diode chip 15. On the light-emitting diode chip 15, in particular on the radiation-emission surface, the luminous means 16 which converts the wavelengths generated by the light-emitting diode chip 15 into white light up to a wavelength of 610 nm is applied as a solid layer. As an alternative, the light-emitting diode chip 15 is embedded in the luminous means 16.

Figure 4:
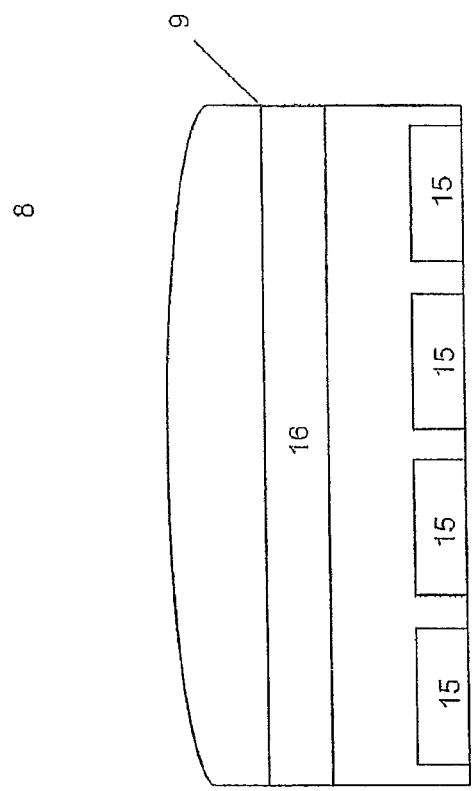
FIG. 4 shows the illumination device of the illumination apparatus in FIG. 1 in a schematic representation as a second exemplary embodiment.

FIG. 4 shows the illumination device 8 of the illumination apparatus 1 in FIG. 1 as a second exemplary embodiment in a schematic representation. In this exemplary embodiment, the illumination device 8 comprises a multiplicity of light-emitting diode chips 15 arranged next to one another in the plastic package 9. The luminous means 16 is arranged in the plastic package 9 as a separate component over the light-emitting diode chips 15 lying next to one another, conversion of the light generated by the light-emitting diode chip 15 also being converted into light with light components of the visible spectrum up to a wavelength of 610 nm. This exemplary embodiment has the advantage that standard components can be used as light-emitting diode chips 15.

LIST OF REFERENCES 1 illumination apparatus
2 cockpit
3 illumination field 4 object (body)
5 night vision instrument
6 field of view
7 scene
8 illumination device
9 plastic package
10 emission spectrum
11 sensitivity spectrum
12 tail section
13 spectrum
14 peak
15 light-emitting diode chip
16 luminous means

What is claimed is:

1. An illumination apparatus for the dazzle-free illumination of a region monitored by a night vision instrument, comprising an illumination device,
   the illumination device comprising at least one light-emitting diode chip and a luminous means,
   the light-emitting diode chip being configured to emit electromagnetic radiation of a first wavelength range, and
   the luminous means being arranged downstream in the optical path of the light-emitting diode chip through a cuvette and being configured to convert the electromagnetic radiation of the first wavelength range in a second wavelength range,
   wherein the illumination apparatus has an overall emission spectrum which is within the second wavelength range, and
   wherein the second wavelength range lies below a wavelength of 610 nm.

2. The illumination apparatus according to claim 1, wherein the luminous means is formed as a fluorescent means or as a phosphorescent means.

3. The illumination apparatus according to claim 1, wherein the luminous means is formed so that it is solid or liquid.

4. The illumination apparatus according to claim 1, wherein the luminous means is formed as an SrGa2S4:Eu composite.

5. The illumination apparatus according to claim 1, wherein the at least one light-emitting diode chip is embedded together with the luminous means in a plastic package.

6. The illumination apparatus according to claim 1, wherein the at least one light-emitting diode chip is formed as a light-emitting diode chip emitting blue light.

7. The illumination apparatus according to claim 1, wherein the at least one light-emitting diode chip is formed as a light-emitting diode chip emitting UV light.

8. The illumination apparatus according to claim 1, wherein the illumination device is formed in the structure of a white LED.

9. The illumination apparatus according to claim 1, wherein the illumination apparatus has a multiplicity of illumination devices, the illumination devices respectively comprising the at least one light-emitting diode chip and the luminous means.

10. The illumination apparatus according to claim 1, wherein the at least one light-emitting diode chip and the luminous means are formed as two separate components in the illumination device.

11. The illumination apparatus according to claim 1, wherein the illumination apparatus is formed as instrument illumination, interior illumination, onboard computer illumination, cockpit illumination and/or as a reading lamp.

12. A method for the dazzle-free illumination of a region monitored by a night vision instrument comprising, at least partially illuminating the region monitored by the night vision instrument by the illumination apparatus according to claim 1.

13. An arrangement comprising a night vision instrument and an illumination apparatus, wherein the night vision instrument defines a field of view and the illumination apparatus defines an illumination filed, wherein the field of view and the illumination field overlap each other to define a common region, wherein the night vision instrument and the illumination apparatus are activated synchronously,
   the illumination apparatus comprising an illumination device, which device comprises at least one light-emitting diode chip and a luminous means,
   the light-emitting diode chip being configured to emit electromagnetic radiation of a first wavelength range, and
   the luminous means being arranged downstream in the optical path of the light-emitting diode chip through a cuvette and being configured to convert the electromagnetic radiation of the first wavelength range into light in a second wavelength range,
   wherein the illumination apparatus has an overall emission spectrum which is within the second wavelength range, such that dazzle-free illumination of the common region can be implemented, and
   wherein the second wavelength range lies below a wavelength of 610 nm.

* * * * *